(12) United States Patent
Zhang et al.

(10) Patent No.: US 9,334,583 B2
(45) Date of Patent: May 10, 2016

(54) METHOD OF PREVENTING AUTO-DOPING DURING EPITAXIAL LAYER GROWTH BY CLEANING THE REACTION CHAMBER WITH HYDROGEN CHLORIDE

(75) Inventors: Chao Zhang, Shanghai (CN); Zhitang Song, Shanghai (CN); Xudong Wan, Shanghai (CN); Bo Liu, Shanghai (CN); Guanping Wu, Shanghai (CN); Ting Zhang, Shanghai (CN); Zuoya Yang, Shanghai (CN); Zhifeng Xie, Shanghai (CN)

(73) Assignee: SHANGHAI INSTITUTE OF MICROSYSTEM AND INFORMATION TECHNOLOGY, CHINESE ACADEMY OF SCIENCES, Changning District, Shanghai (CN)

( * ) Notice: Subject to any disclaimer, the term of this patent is extended or adjusted under 35 U.S.C. 154(b) by 0 days.

(21) Appl. No.: 13/202,944

(22) PCT Filed: Jun. 27, 2011

(86) PCT No.: PCT/CN2011/076425
§ 371 (c)(1),
(2), (4) Date: Aug. 23, 2011

(87) PCT Pub. No.: WO2012/028024
PCT Pub. Date: Mar. 8, 2012

(65) Prior Publication Data
US 2013/0145984 A1 Jun. 13, 2013

(30) Foreign Application Priority Data
Aug. 31, 2010 (CN) .......................... 2010 1 0271287

(51) Int. Cl.
*C30B 25/02* (2006.01)
*C30B 25/18* (2006.01)
(Continued)

(52) U.S. Cl.
CPC ............. *C30B 25/186* (2013.01); *C30B 23/025* (2013.01); *C30B 25/02* (2013.01);
(Continued)

(58) Field of Classification Search
CPC ........ C30B 25/00; C30B 25/02; C30B 25/10; C30B 29/02; C30B 29/06; C30B 31/06; C30B 31/08; C30B 31/12; C30B 31/14; C30B 31/16; C30B 31/18
USPC ........... 117/2–3, 84, 88–90, 94, 97, 105–106, 117/928, 935; 438/503, 505–509
See application file for complete search history.

(56) References Cited

U.S. PATENT DOCUMENTS 4,592,792 A * 6/1986 Corboy, Jr. ........ H01L 21/76294
117/102
4,859,626 A * 8/1989 Wise .................... H01L 21/2205
117/90

(Continued)

*Primary Examiner* — Kenneth A Bratland, Jr.
(74) *Attorney, Agent, or Firm* — Global IP Services; Tianhua Gu

(57) ABSTRACT

An epitaxial growth method for preventing auto-doping effect is presented. This method starts with the removal of impurities from the semiconductor substrate and the reaction chamber to be used. Then the semiconductor substrate is loaded in the cleaned reaction chamber to be pre-baked under vacuum conditions before the extraction of the dopant atoms desorbed from the surface of the semiconductor substrate. Next, under high temperature and low gas flow conditions, a first intrinsic epitaxial layer is formed on the surface of said semiconductor substrate. Following this, under low temperature and high gas flow conditions, a second epitaxial layer of required thickness is formed on the structural surface of the grown intrinsic epitaxial layer. Last, silicon wafer is unloaded after cooling. This method can prevent auto-doping effect during the epitaxial growth on semiconductor substrate and thus ensure the performance and enhance the reliability of the devices in peripheral circuit region.

10 Claims, 4 Drawing Sheets

(51) Int. Cl.
*C30B 29/06* (2006.01)
*C30B 23/02* (2006.01)
*H01L 21/02* (2006.01)

(52) U.S. Cl.
CPC ............ *C30B 29/06* (2013.01); *H01L 21/0262* (2013.01); *H01L 21/02381* (2013.01); *H01L 21/02532* (2013.01); *H01L 21/02576* (2013.01); *H01L 21/02661* (2013.01)

(56) References Cited

U.S. PATENT DOCUMENTS

2001/0027744 A1* 10/2001 Dietze .................... C30B 25/02
  117/89
2008/0022924 A1* 1/2008 Kim ........................ C30B 25/02
  117/85

* cited by examiner

METHOD OF PREVENTING AUTO-DOPING DURING EPITAXIAL LAYER GROWTH BY CLEANING THE REACTION CHAMBER WITH HYDROGEN CHLORIDE

FIELD OF THE INVENTION

The present invention relates to a semiconductor field, and more particularly to a method for preventing auto-doping effect on substrate having heavily-doped region during epitaxial growth.

BACKGROUND OF THE INVENTION

Epitaxial technology where heavily arsenic (As)-doped semiconductor acts as substrate has been increasingly widely used in device fabrication, and especially in diode, triode, VDMOS, varactor diode, IGBT and etc. With the miniaturization and the increase of integration level of devices, the consistency of epitaxial wafer having heavily As-doped silicon substrate and the transition region width of epitaxial layer are crucial for the performance and reliability of devices.

During chemical vapor epitaxy, the impurity of As is unavoidable between the epitaxial layer and the heavily-doped region of substrate and between the epitaxial layer and the undoped region of substrate. Take the example of the growth of intrinsic epitaxial layer on silicon wafer having heavily-doped region, wherein an impurity distribution vertical to heavily-doped region is named as vertical auto doping (as the direction indicated by AA' in FIG. 1) and an impurity distribution not vertical to heavily-doped region is named as horizontal auto doping (as the direction indicated by BB' in FIG. 1), wherein the impurity vertical diffusion mainly comprises two parts of 1. solid thermal diffusion at the interface between the epitaxial layer and the heavily-doped substrate and 2. auto-doping of the impurity ion absorbed by the substrate surface or the impurity gas in the background atmosphere into the epitaxial layer during epitaxial growth, and wherein horizontal auto doping effect is mainly caused by the second phenomenon.

Conventional silicon wafer epitaxial process of heavily As-doped substrate mainly utilizes the process of so-called "two-step epitaxy", wherein key steps are as follow: 1. loading the substrate in the reaction chamber with the temperature increased to 1000-1200° C. before the hydrogen chloride (HCl) is introduced to clean the substrate surface and the inner wall of the reaction chamber; 2. introducing a large amount of hydrogen (H2) to clean the inner wall of the reaction chamber and the substrate so as to remove the impurity absorbed on the substrate surface and in the reaction chamber; 3. growing an intrinsic epitaxial layer to prevent further out-diffusion of impurities from the substrate; 4. re-introducing a large amount of H2 into the reaction chamber to clean the inner wall of the reaction chamber and the substrate so as to remove impurities absorbed on the substrate surface and in the reaction chamber; and 5. performing a second stage growth until a desired thickness of the epitaxial layer is reached. Conventional process of "two-step epitaxy" has the advantage of minimizing the vertical diffusion effect for thick epitaxial layer growth, and the disadvantages of 1. poor inhibition of vertical auto doping effect for thin epitaxial layer growth; and 2. no obvious inhibition of horizontal auto doping effect. Auto-doping effect of As for epitaxial film formed by conventional chemical vapor deposition is as shown in FIG. 2.

Therefore, it is a technical problem for urgent solution to prevent vertical and horizontal diffusion of atoms heavily doped and reduce the doping concentration for epitaxial layer in undoped region during the epitaxial layer growth on substrate having heavily-doped region.

SUMMARY OF THE INVENTION

An object of the present invention is to provide a method of epitaxial layer growth preventing vertical and horizontal diffusion of auto-doping atoms so as to ensure the performance and enhance the reliability of the devices in peripheral circuit region.

In order to solve the above technical problems, the invention adopts the following technical schemes:

Technical Scheme 1:

This technical scheme provides a method of epitaxial growth effectively preventing auto-doping effect, comprising the steps of:

1) Preparing a semiconductor substrate having heavily-doped buried layer and removing surface oxide from said semiconductor substrate;

2) Cleaning the reaction chamber to be used so as to remove dopant atoms and other impurities absorbed on the inner wall of the reaction chamber;

3) Loading said semiconductor substrate into the cleaned reaction chamber and pre-baking said semiconductor substrate under vacuum conditions so as to remove moisture and oxide from the surface of said semiconductor substrate before the extraction of dopant atoms desorbed from the surface of said semiconductor substrate;

4) Under high temperature and low gas flow conditions, growing a first intrinsic epitaxial layer on the surface of said semiconductor substrate where the dopant atoms have been extracted out; and 5) Under low temperature and high gas flow conditions, growing a second epitaxial layer of required thickness on the structural surface of the first intrinsic epitaxial layer formed previously.

Preferably, the dopant used in the heavily-doped buried layer region of said semiconductor substrate is one of arsenic, phosphorus, tellurium and boron; said heavily-doped buried layer region is prepared by ion implantation or solid thermal diffusion; said semiconductor substrate can be silicon or other semiconductor materials such as germanium.

Preferably, in said step 2), the reaction chamber can be cleaned by HCl gas under conditions of a temperature of 1190° C., a flow of 20 sccm, a carrier gas of nitrogen (N2) or H2, and a duration of 30 seconds.

Preferably, said first and second intrinsic epitaxial layers are formed at a low pressure of less than 100 Torr.

Preferably, dichlorosilane is used as source gas for the growth of the first and second intrinsic epitaxial layers, wherein a low growth rate can be achieved by controlling the flow of dichlorosilane gas and the carrier gas of hydrogen.

Preferably, the growth method used for said first and second intrinsic epitaxial layers is chemical vapor epitaxy or molecular beam epitaxy.

Preferably, said first intrinsic epitaxial layer is grown with a thickness between 10 and 200 nm, wherein growth conditions are a temperature in the range of 1100° C. to 1250° C., a dichlorosilane flow in the range of 50 sccm to 400 sccm, and a hydrogen flow in the range of 5 slm to 80 slm.

Preferably, said second epitaxial layer is grown under conditions of a temperature in the range of 900° C. to 1250° C., and a dichlorosilane flow in the range of 100 sccm to 800 sccm.

Preferably, said second epitaxial layer is undoped layer, P type doped layer, or N type doped layer, wherein dopant atoms for said P type doped layer can be boron and dopant atoms for said N type doped layer can be phosphorus or arsenic.

Preferably, said pre-baking conditions in step 3) are a temperature in the range of 1000° C. to 1250° C., a duration of 20 seconds to 10 minutes, and an atmosphere of inert gas.

Preferably, said inert gas is hydrogen or nitrogen.

The epitaxial growth method in foregoing technical scheme 1 is more suitable for use when the area of the heavily-doped buried layer region is less than 50% of the surface area of the semiconductor substrate.

Technical Scheme 2:

This technical scheme provides a method of epitaxial growth effectively preventing auto-doping effect with an additional step, based on the technical scheme 1, of partial etch of the first intrinsic epitaxial layer to reduce the thickness of said first intrinsic epitaxial layer and remove the surface dopant atoms thereon.

Preferably, HCl gas can be introduced into said reaction chamber to etch said first intrinsic epitaxial layer.

Preferably, conditions of etching the first intrinsic epitaxial layer are a temperature in the range of 1100° C. to 1200° C. and a pressure of less than 40 Torr.

Preferably, the method of epitaxial growth in this technical scheme can be used when the area of the heavily-doped buried layer region of said semiconductor substrate is greater than half of the surface area of said semiconductor substrate.

Technical Scheme 3:

This technical scheme provides a method of epitaxial growth effectively preventing auto-doping effect, wherein the pre-baking step in technical scheme 1 is replaced by a step of etching the surface of said semiconductor substrate; that is to say, under vacuum and high temperature conditions, gas is introduced to clean the surface of said semiconductor substrate so as to etch away dopant atoms absorbed on said semiconductor substrate surface and extract them out of the reaction chamber.

Preferably, said vacuum and high temperature conditions are a temperature of 1200° C., a pressure of about 20 Torr and a duration of 30 seconds.

The invention has the advantages that:

(1) said "pre-baking" process in the method of epitaxial growth in the invention can effectively prevent horizontal auto-doping effect;

(2) the growth of intrinsic epitaxial layer adopts an epitaxial method of low pressure, high temperature, low gas (DCS) flow and low deposition rate, wherein the process conditions of this step are also crucial to prevent horizontal auto-doping effect;

(3) HCl is adopted to etch back the first thin intrinsic epitaxial layer and thus reduce horizontal auto-doping effect;

(4) before the semiconductor substrate is loaded in the reaction chamber, HCl gas is used under high temperature to clean dopant atoms absorbed by the inner wall of the reaction chamber, which greatly reduce the possibility of auto-doping of impurity gas of the background atmosphere into the epitaxial layer during the epitaxial growth; and (5) process conditions for the growth of ultra thin epitaxial layer (0.2~0.6 microns) are provided.

DETAILED DESCRIPTION OF THE EMBODIMENTS

The technical schemes of the embodiments of the present invention are described below in a detailed and complete manner with reference to the accompanying drawings of the embodiments of the present invention. Obviously, the described embodiments are only a part of the embodiments of the present invention, but not all embodiments. Without creative effort, all other embodiments to be acquired by an ordinary person skilled in the art on the basis of the embodiments of the present invention belong to the protection scope of the present invention.

In order to further clarify the object, technical schemes and advantages of the invention, the method of epitaxial growth effectively preventing auto-doping effect of the invention is described in detail below with reference to the accompanying drawings. It shall be noted that the following description of each embodiment is based on that arsenic is used as the dopant in the heavily-doped buried layer region of the semiconductor substrate; however, a person skilled in the art shall understand that the dopants in the heavily-doped buried layer region are not limited to arsenic, but include other materials such as phosphorus, tellurium and boron, and that semiconductor substrate materials include but are not limited to silicon as well.

Embodiment 1

Figure 3:
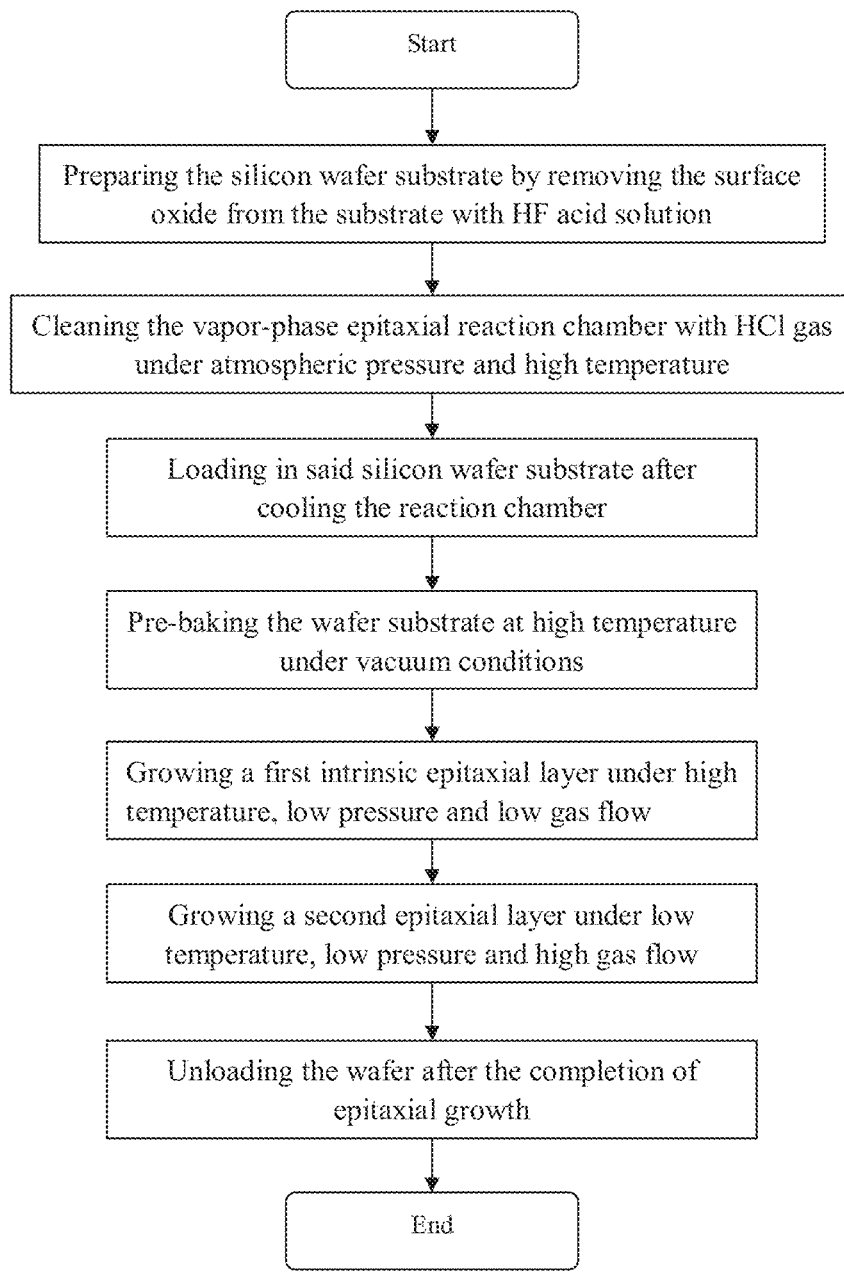
FIG. 3 is a flowchart of a method of epitaxial growth effectively preventing auto-doping effect according to the present invention.

Please refer to FIG. 3. The method of epitaxial growth effectively preventing auto-doping effect of this embodiment comprises the following steps:

Firstly, form a silicon wafer substrate having heavily-doped buried layer region by As ion implantation, wherein the depth of said buried layer is 0.4 μm and the heavy doping concentration of said buried layer is 8E19 atoms/cm3.

Next, HF acid solution is used to remove the surface oxide from said silicon wafer substrate.

Next, before said silicon wafer substrate is loaded in the reaction chamber, introduce HCl gas into the reaction chamber to clean the reaction chamber under atmospheric pressure and high temperature (as the temperature graph shown in FIG. 4) so as to remove dopant atoms and other impurities absorbed on the inner wall of the reaction chamber, wherein preferred conditions are a temperature of 1190° C., a HCl flow of about 20 sccm, a carrier gas of N2 or H2, and a duration of 30 seconds.

Next, cool the reaction chamber to a low temperature (e.g., of about 850° C.) before load in said silicon wafer substrate having heavily-doped buried layer region.

Next, under vacuum and high temperature conditions, pre-bake said silicon wafer substrate so as to remove moisture and oxide caused by exposure to air from the surface of said silicon wafer substrate. The dopant atoms of As absorbed on the surface of silicon wafer substrate are much easier to be desorbed under high temperature before said desorbed As atoms are extracted out of the reaction chamber under low vacuum conditions, which in turn better the prevention of the horizontal auto doping of As. Preferred pre-baking conditions are a temperature of 1150° C., a pressure of about 20 Torr (1 Torr=1/760 atm=1 mmHg=133.322 Pa), a hydrogen flow of 60 slm, and a duration of 20 seconds.

Next, a first thin intrinsic epitaxial layer is grown under conditions of a high temperature (e.g., 1150° C.), a low pressure (e.g., of about 20 Torr), and a low DCS gas flow (e.g., of about 122 sccm) wherein a preferred thickness is about 100 nm and a duration is 20 seconds. On one hand, the process conditions of high temperature enable the dopant atoms absorbed on the surface of the heavily-doped buried layer region to be desorbed and extracted out of the reaction chamber, and, on the other hand, the process conditions of high temperature and low deposition rate facilitate the improvement of the crystal lattice structure of the epitaxial layer ready to be formed and reduce the absorption of the dopant atoms on the freshly formed surface of the epitaxial layer.

Lastly, a main silicon epitaxial layer of required thickness is grown under conditions of a low temperature (of 1000° C.), a low pressure (of 70 Torr), and a high DCS gas flow (of 400 sccm) so as to form a required epitaxial layer structure, wherein a typical epitaxial layer thickness is 0.3 $\mu$m, 0.4 $\mu$m, 0.6 $\mu$m, 0.8 $\mu$m and etc.

Figure 1:
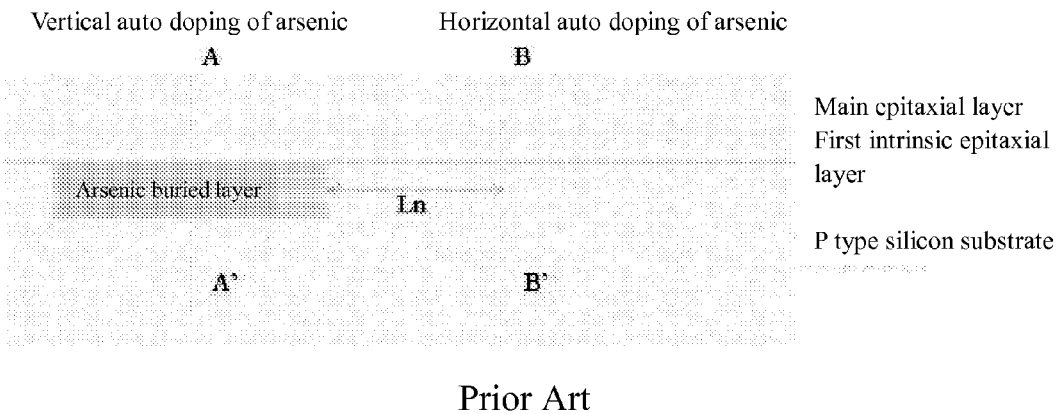
FIG. 1 is a schematic view of the structure of silicon wafer having heavily-doped region.
Figure 2:
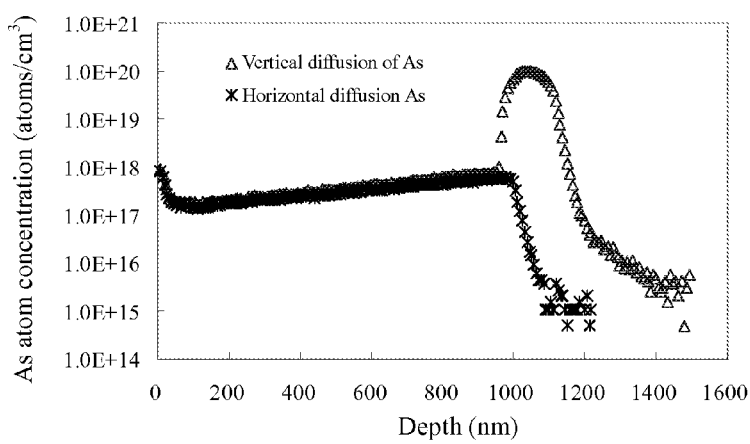
FIG. 2 is a schematic view of arsenic auto-doping in an epitaxial film formed by conventional chemical vapor deposition.
Figure 4:
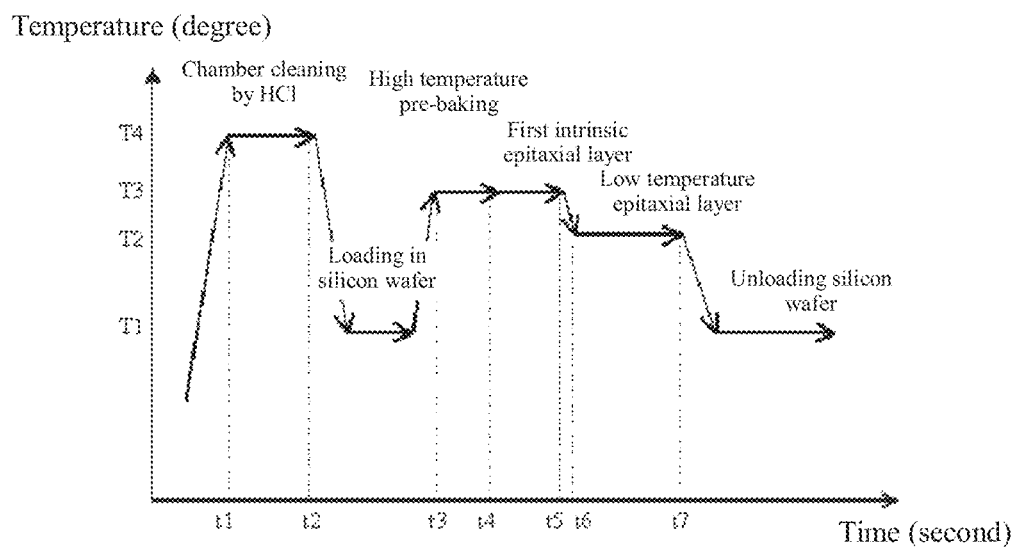
FIG. 4 is a temperature graph adopted by each step in method of epitaxial growth effectively preventing auto-doping effect according to the present invention.
Figure 5:
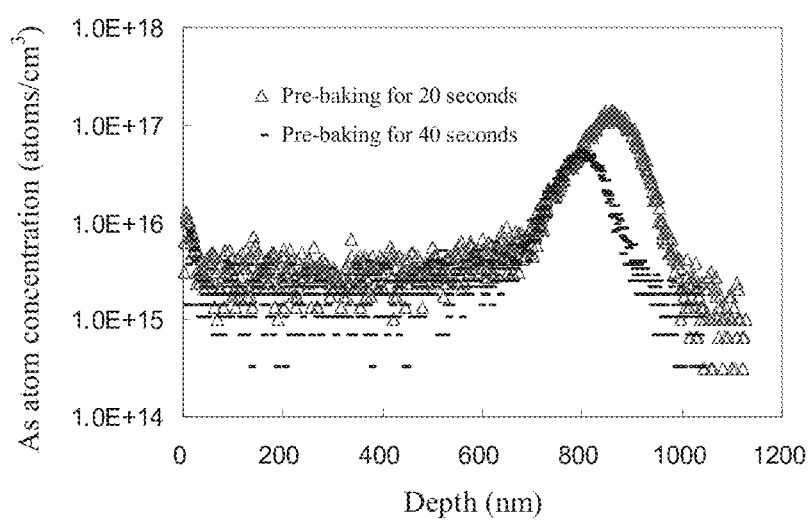
FIG. 5 is a schematic view showing the relationship between pre-baking time and horizontal auto-doping effect of arsenic in the method of epitaxial growth effectively preventing auto-doping effect according to the present invention.
Figure 6:
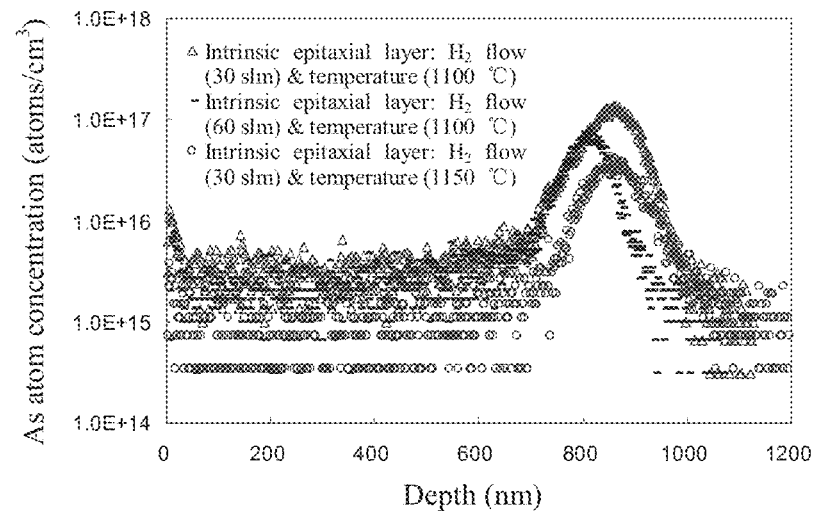
FIG. 6 is a schematic view showing the relationship between deposition time and hydrogen flow of the first intrinsic epitaxial layer and horizontal auto-doping effect of arsenic in the method of epitaxial growth effectively preventing auto-doping effect according to the present invention.
Figure 7:
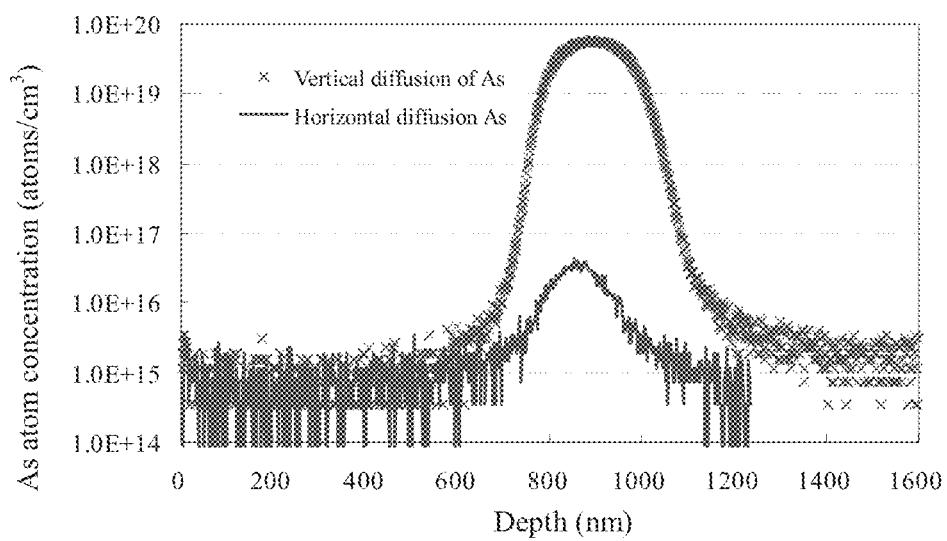
FIG. 7 is a schematic view of the auto-doping effect of arsenic of the epitaxial film deposited by the method of epitaxial growth effectively preventing auto-doping effect according to the present invention.

The epitaxial films prepared by the method of epitaxial growth adopted in this embodiment and by the prior methods have the same structure, as shown in FIG. 1; however, in this embodiment, wherein temperatures employed for each step is as shown in FIG. 4, if the pre-baking time is prolonged, the As concentration of the interface between the epitaxial layer and the undoped substrate will decrease with the increase of the pre-baking time; that is to say, the horizontal auto-doping effect of As is further inhibited when the pre-baking time increases, specifically as shown in FIG. 5. FIG. 6 is the schematic view showing the relationship between the horizontal auto-doping effect of As and the deposition time and hydrogen flow of the first intrinsic epitaxial layer, and, as shown in this figure, no matter increasing the growth temperature of the first intrinsic epitaxial layer or reducing the deposition rate by increasing the carrier gas flow, the As concentration of the interface between the epitaxial layer and the substrate that is not heavily doped is greatly reduced. Also, as shown in FIG. 7, both the vertical and horizontal auto doping effects of As atoms are effectively prevented, wherein the impurity concentrations of As in the epitaxial layers of both heavily-doped and undoped silicon wafer substrates are around 1E15 atoms/cm3, which are far below the impurity concentration in the epitaxial layer formed by conventional epitaxial growth process (as shown in FIG. 2).

As can be seen from the above, the method of epitaxial growth on silicon wafer substrate adopted in this embodiment effectively prevents the vertical and horizontal auto-doping effect of arsenic atoms caused by heavily-doping buried layer region, which is of significant importance for the use of diode array of low resistance buried layer and the application of high-speed BiCMOS, IGBT and other devices. During the process, dopant atoms absorbed on the surface of the silicon wafer substrate are desorbed and extracted out of the reaction chamber by pre-baking under high temperature and low pressure conditions, the first intrinsic epitaxial layer is grown at low deposition rate (high temperature, low pressure and low gas flow) to improve the crystal lattice quality of the epitaxial layer and cover the heavily-doped buried layer so as to prevent the horizontal auto doping of dopant atoms, and the main epitaxial layer (i.e., the second epitaxial layer) is grown under low temperature, low pressure and high gas flow conditions, characterized by high deposition rate, low temperature and the reduction of the diffusion of dopant atoms in the buried layer.

Embodiment 2

The method of epitaxial growth effectively preventing auto-doping effect of this embodiment comprises the following steps:

Step 1: form a silicon wafer substrate having heavily-doped buried layer by solid thermal diffusion of heavily As-doped silicon glass, wherein said buried layer has a depth of 0.5 microns and the heavy doping concentration of said buried layer is 3E19 atoms/cm3.

Step 2: remove the surface oxide from the silicon wafer substrate with HF acid solution.

Step 3: before said silicon wafer substrate is loaded in the reaction chamber, introduce HCl gas into the reaction chamber to clean the reaction chamber under atmospheric pressure and high temperature so as to remove dopant atoms and other impurities absorbed on the inner wall of the reaction chamber, wherein a typical temperature is 1190° C., a HCl flow is about 20 sccm, a carrier gas is N2 or H2, and a duration is 30 seconds.

Step 4: cool the reaction chamber to a low temperature (e.g., of about 850° C.) before load in said silicon wafer substrate.

Step 5: under vacuum and high temperature conditions, pre-bake said silicon wafer substrate under conditions of a temperature of 1150° C., a pressure of about 20 Torr and a duration of 20 seconds.

Step 6: a first thin intrinsic epitaxial layer is grown under conditions of a high temperature (e.g., 1150° C.), a low pressure (e.g., of about 20 Torr), and a low DCS gas flow (e.g., of about 122 sccm), wherein a preferred thickness is about 100 nm and a duration is 20 seconds.

Step 7: a silicon epitaxial layer of required thickness is grown under conditions of a low temperature (e.g., of 1000° C.), a low pressure (e.g., of 70 Torr), and a high DCS gas flow (e.g., of 400 sccm) so as to form a required epitaxial layer structure, wherein a typical epitaxial layer thickness is 0.3 $\mu$m, 0.4 $\mu$m, 0.6 $\mu$m, and etc.

This embodiment has the advantage that the buried layer is formed by solid thermal diffusion of heavily As-doped silicon glass, which provides a simpler process.

Embodiment 3

The method of epitaxial growth effectively preventing auto-doping effect of this embodiment comprises the following steps:

Firstly, form a silicon wafer substrate having heavily-doped buried layer by As ion implantation or by solid thermal diffusion of heavily As-doped silicon glass.

Next, remove the surface oxide from the silicon wafer substrate with HF acid solution.

Next, before said silicon wafer substrate is loaded in the reaction chamber, introduce HCl gas into the reaction chamber to remove, under atmospheric pressure and high temperature, dopant atoms and other impurities absorbed on the inner wall of the reaction chamber, wherein a typical temperature is 1190° C., a HCl flow is about 20 sccm, a carrier gas is N2 or H2, and a duration is 30 seconds.

Next, cool the reaction chamber to a low temperature (e.g., of about 850° C.) before load in said silicon wafer substrate.

Next, under vacuum conditions, pre-bake said silicon wafer substrate under conditions of a temperature of 1150° C., a pressure of about 20 Torr and a duration of 20 seconds.

Next, a first thin intrinsic epitaxial layer is grown under conditions of a high temperature (of 1150° C.), a low pressure (of about 20 Torr), and a low DCS gas flow (of about 122 sccm), wherein a preferred thickness is about 20 nm and a duration is 40 seconds.

Next, under conditions of a high temperature (of 1150° C.) and a low pressure (of about 20 Torr), HCl gas is introduced to etch the surface of said first thin intrinsic epitaxial layer so as to remove partial thickness thereof and dopant atoms absorbed on the surface of the epitaxial layer, wherein said etch thickness is less than or equal to the thickness of the first epitaxial layer.

Lastly, a second epitaxial layer (e.g., a P type doped layer or a N type doped layer) of required thickness is grown under conditions of a low temperature (of 1000° C.), a low pressure (of 70 Torr), and a high DCS gas flow (of 400 sccm) so as to form a required epitaxial layer structure, wherein a typical epitaxial layer thickness is 0.3 µm, 0.4 µm, 0.6 µm, 0.8 µm and etc.

This embodiment has the advantage that, upon the growth of the first intrinsic epitaxial layer, HCl gas is used to etch the surface thereof under high temperature and low pressure conditions to remove partial thickness thereof and dopant atoms absorbed on the surface of the epitaxial layer, and therefore prevent the auto-doping effect of dopant atoms. This embodiment is more suitable for the epitaxial growth of silicon wafer substrate where the area of the heavily-doped buried layer region is large (normally when the area of the heavily-doped region is more than 50% of the surface area of the silicon wafer substrate).

Embodiment 4

The method of epitaxial growth effectively preventing the auto-doping effect of arsenic of this embodiment comprises the following steps:

Firstly, form a silicon wafer substrate having heavily-doped buried layer by As ion implantation or by solid thermal diffusion of heavily As-doped silicon glass, wherein said buried layer has a depth of 0.3 microns and the doping concentration of said buried layer is 3E19 atoms/cm3.

Next, remove the surface oxide from said silicon wafer substrate with HF acid solution.

Next, before said silicon wafer substrate is loaded in the reaction chamber, introduce HCl gas into the reaction chamber to clean the reaction chamber under atmospheric pressure and high temperature so as to remove dopant atoms and other impurities absorbed on the inner wall of the reaction chamber, wherein a typical temperature is 1190° C., a HCl flow is about 20 sccm, a carrier gas is N2 or H2, and a duration is 30 seconds.

Next, cool the reaction chamber to a low temperature (e.g., of about 850° C.) before load in said silicon wafer substrate.

Next, under vacuum and high temperature conditions, introduce HCl gas to clean the surface of said silicon wafer substrate so as to etch away dopant atoms absorbed on the surface of the silicon wafer substrate and extract them out of the reaction chamber, wherein a temperature is 1200° C., a pressure is about 20 Torr and a duration is 30 seconds during the etch process.

Next, a first thin intrinsic epitaxial layer is grown under conditions of a high temperature (of 1150° C.), a low pressure (of about 20 Torr), and a low DCS gas flow (of about 122 sccm), wherein a typical thickness is 20 nm and a duration is 40 seconds.

Lastly, a silicon epitaxial layer of required thickness is grown under conditions of a low temperature (of 1000° C.), a low pressure (of 70 Torr), and a high DCS gas flow (of 400 sccm) so as to form a required epitaxial layer structure, wherein a typical epitaxial layer thickness is 0.3 µm, 0.4 µm, 0.6 µm, 0.8 µm and etc.

This embodiment is different from foregoing embodiments in that pre-baking is replaced by the introduction of HCl gas into the reaction chamber to etch the semiconductor substrate surface and remove the surface dopant atoms thereof and therefore prevent the auto-doping effect of dopant atoms.

To sum up, the present invention provides a method of epitaxial growth effectively preventing vertical and horizontal auto-doping effect, wherein a semiconductor substrate is subject to a process of pre-baking or etch at first, then an intrinsic layer is formed under high temperature and low gas flow conditions, and next a main epitaxial layer is grown under low temperature and high gas flow conditions. As a result, the auto-doping effect of arsenic atoms is effectively prevented and a relatively thin epitaxial layer is obtained. This method is suitable not only to the fabrication of the driving diode of phase change memory, but also to the fabrication of other electronic devices, and, in particular, of high application value to the fabrication of triode, high-speed BiCMOS and so on.

What is claimed is:

1. An epitaxial growth method for preventing an auto-doping effect, characterized by consisting of the following steps:
   1) Preparing a semiconductor substrate having a doped buried layer and removing a surface oxide from said semiconductor substrate;
   2) Cleaning a reaction chamber to be used so as to remove impurities from an inner wall of the reaction chamber, wherein the reaction chamber is cleaned by HCl gas under conditions of a HCl flow of 20 sccm, a temperature of 1190° C., a carrier as of $N_2$ or $H_2$, and a duration of 30 seconds;
   3) Loading said semiconductor substrate into the cleaned reaction chamber and prebaking said semiconductor substrate under vacuum and a temperature between 1000-1250° C. conditions so as to remove moisture and oxide from the surface of said semiconductor substrate before said dopant atoms are extracted out of the reaction chamber under low vacuum conditions, said dopant atom is arsenic, phosphorus, tellurium or boron;
   4) Under high temperature and low gas flow conditions, wherein the high temperature and low gas flow conditions are a temperature in the range of 1000° C. to 1250° C., a dichlorosilane flow in the range of 50 sccm to 400 sccm, and a hydrogen flow in the range of 5 slm to 80 slm, growing a first intrinsic epitaxial layer on the surface of said semiconductor substrate where the dopant atoms have been extracted out, the first intrinsic epitaxial layer has a thickness between 10 and 200 nm;
   5) partial etching the first intrinsic epitaxial layer to reduce the thickness of said first intrinsic epitaxial layer and remove the surface dopant atoms thereon, wherein HCl gas is introduced into said reaction chamber to etch said first intrinsic epitaxial layer, with the etch conditions of a temperature in the range of 1100° C. to 1200° C. and a pressure of less than 40 Torr; and 6) Under low temperature and high gas flow conditions, wherein the low temperature and low gas flow conditions are a temperature in the range of 900° C. to 1250° C., and a dichlorosilane flow in the range of 100 sccm to 800 sccm, growing a second epitaxial layer of required thickness on the structural surface of the first intrinsic epitaxial layer formed previously, wherein the first intrinsic epitaxial layer and the second epitaxial layer forms the required epitaxial layer structure, which has a thickness of 0.2 to 0.6 micron, and wherein said first and second intrinsic epitaxial layers are formed at a low pressure of less than 100 Torr.

2. The epitaxial growth method for preventing an auto-doping effect according to claim 1, characterized in that said doped buried layer region is prepared by ion implantation or solid thermal diffusion.

3. The epitaxial growth method for preventing an auto-doping effect according to claim 1, characterized in that dichlorosilane is used as source gas for the growth of the first and second intrinsic epitaxial layers.

4. The epitaxial growth method for preventing an auto-doping effect according to claim 1, characterized in that the growth method used for the first and second intrinsic epitaxial layers is chemical vapor epitaxy or molecular beam epitaxy.

5. The epitaxial growth method for preventing an auto-doping effect according to claim 1, characterized in that said second epitaxial layer is an undoped layer, P type doped layer, or N type doped layer.

6. The epitaxial growth method for preventing an auto-doping effect according to claim 5, characterized in that the dopant atom for said P type doped layer is boron, and the dopant atom for said N type doped layer is phosphorus or arsenic.

7. The epitaxial growth method for preventing an auto-doping effect according to claim 1, characterized by said pre-baking conditions of a temperature in the range of 1000° C. to 1250° C., a duration of 20 seconds to 10 minutes, and an atmosphere of inert gas.

8. The epitaxial growth method for preventing an auto-doping effect according to claim 7, characterized in that said inert gas is hydrogen or nitrogen.

9. The epitaxial growth method for preventing an auto-doping effect according to claim 1, characterized by including said step of partial etch of the first intrinsic epitaxial layer when the surface area of the doped buried layer region of said semiconductor substrate is greater than half of the surface area of said semiconductor substrate.

10. The epitaxial growth method for preventing an auto-doping effect according to claim 1, characterized in that the pre-baking step of said step 3) is replaced by a step of etching the surface of said semiconductor substrate; that is to say, under vacuum and high temperature conditions, wherein the vacuum and high temperature conditions are a temperature of 1200° C., a pressure of 20 Torr, and a duration of 30 seconds, gas is introduced to clean the surface of said semiconductor substrate so as to etch away the dopant atoms absorbed on said semiconductor substrate surface and extract them out of the reaction chamber.

* * * * *